United States Patent
Fuller et al.

(10) Patent No.: US 11,127,444 B1
(45) Date of Patent: Sep. 21, 2021

(54) SIGNAL RECEIVER WITH SKEW-TOLERANT STROBE GATING

(71) Applicant: Rambus Inc., San Jose, CA (US)

(72) Inventors: Andrew Fuller, Durham, NC (US); Robert E. Palmer, Chapel Hill, NC (US); Thomas J. Giovannini, San Jose, CA (US); Michael D. Bucher, Carrboro, NC (US); Thoai Thai Le, Cary, NC (US)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 16/995,612

(22) Filed: Aug. 17, 2020

Related U.S. Application Data (60) Provisional application No. 62/889,537, filed on Aug. 20, 2019.

(51) Int. Cl.
  *G11C 7/22* (2006.01)
  *G11C 7/10* (2006.01)

(52) U.S. Cl.
  CPC .......... *G11C 7/222* (2013.01); *G11C 7/1066* (2013.01); *G11C 7/1072* (2013.01); *G11C 7/1093* (2013.01)

(58) Field of Classification Search
  CPC ..... G11C 7/222; G11C 7/1072; G11C 7/1066; G11C 7/1093
  See application file for complete search history.

(56) References Cited

U.S. PATENT DOCUMENTS

| | | |
|---|---|---|
| 6,092,212 A | 7/2000 | Muljono et al. |
| 6,774,694 B1 * | 8/2004 | Stern .................. H03K 5/1508 327/276 |
| 7,016,237 B2 | 3/2006 | Lee et al. |
| 7,457,175 B1 | 11/2008 | Griffith et al. |
| 8,233,332 B2 | 7/2012 | Nguyen et al. |
| 8,270,235 B2 | 9/2012 | Swanson et al. |
| 8,295,118 B2 | 10/2012 | Best et al. |
| 8,352,696 B2 | 1/2013 | Hampel |
| 8,553,475 B2 | 10/2013 | Ware |
| 8,619,479 B2 | 12/2013 | Yoon |
| 8,666,007 B2 | 3/2014 | Best et al. |
| 8,688,399 B2 | 4/2014 | Best |
| 8,743,635 B2 | 6/2014 | Kizer et al. |
| 8,824,224 B2 | 9/2014 | Ware et al. |
| 9,257,163 B2 | 2/2016 | Stott et al. |
| 9,368,172 B2 | 6/2016 | Palmer et al. |
| 9,514,420 B2 | 12/2016 | Bose et al. |
| 9,892,771 B2 | 2/2018 | Palmer et al. |
| 2007/0162719 A1 | 7/2007 | Kelly |
| 2007/0201286 A1 | 8/2007 | Oh |
| 2008/0144405 A1 | 6/2008 | Teh et al. |
| 2011/0299347 A1 | 12/2011 | Swanson et al. |
| 2012/0120744 A1 | 5/2012 | Yoon |

(Continued)

*Primary Examiner* — Ajay Ojha
(74) *Attorney, Agent, or Firm* — Charles Shemwell (57) ABSTRACT

A first-in-first-out (FIFO) storage structure within an integrated-circuit component is loaded with qualification values corresponding to respective pairs of edges expected within a timing strobe signal transmitted to the integrated-circuit component. The qualification values are sequentially output from the FIFO storage structure during respective cycles of the timing strobe signal and a gate signal is either asserted or deasserted during the respective cycles of the timing strobe signal according to the qualification values output from the FIFO storage structure.

21 Claims, 9 Drawing Sheets

(56) References Cited

U.S. PATENT DOCUMENTS

| | | |
|---|---|---|
| 2014/0218204 A1 | 8/2014 | Savage, Jr. |
| 2014/0355366 A1 | 12/2014 | Gay |
| 2014/0355367 A1 | 12/2014 | Gay |
| 2015/0063043 A1 | 3/2015 | Eckel |
| 2015/0063044 A1 | 3/2015 | Byun et al. |

* cited by examiner

SIGNAL RECEIVER WITH SKEW-TOLERANT STROBE GATING

CROSS REFERENCE TO RELATED APPLICATIONS

This application hereby claims priority to and incorporates by reference U.S. Provisional Application No. 62/889,537 filed Aug. 20, 2019.

TECHNICAL FIELD

The present disclosure relates to the field of chip-to-chip signaling; signaling between integrated circuit devices.

BACKGROUND

In strobe-timed signaling systems, "active" strobe edges that mark data sampling instants are preceded and succeeded by characteristic strobe preamble and postamble waveforms having idle-to-ready transitions and vice-versa—overhead transitions that are removed ("gated out") from the timing signal supplied to trigger signaling sampling operations within link receivers. The interval between preamble transition and the first active strobe edge (and/or final active strobe edge and postamble transition) may be as brief as a bit-time, imposing tight assertion/deassertion timing margins for the "gate" signal used to frame (pass) active strobe edges and block overhead (non-active) strobe edges. Gate signal generation is further complicated by time-varying skew between the incoming strobe/data ensemble and the internal clock domain of the receiving chip—phase lead or lag that may drift beyond one or more bit-time intervals—and by data access protocols in which successive data bursts may follow one another so closely as to leave insufficient time for complete strobe postamble and/or preamble waveforms.

DRAWINGS

The various embodiments disclosed herein are illustrated by way of example, and not by way of limitation, in the figures of the accompanying drawings and in which like reference numerals refer to similar elements and in which.

DETAILED DESCRIPTION

In various embodiments disclosed herein, a strobe gating signal is generated adaptively based on timing events in the incoming strobe signal itself to yield a gating window that opens and closes deterministically with respect to active edges of the strobe signal. In a number of embodiments, the gating signal is asserted in response to a qualified transition or logic level in the strobe preamble that precedes the first active strobe edge and then deasserted in response to the final active strobe edge, thus effecting a gating window that drifts—relative to the receive-side timing domain—with the strobe signal itself. Further, qualification of the preamble feature (transition or logic level according to preamble type) that triggers gate-signal assertion is implemented by either of two alternate gate-enable signals according to traffic conditions—one gate-enable timed by a reference clock within the receive-side timing domain and the other timed by edges of the strobe signal itself and thus aligned with the strobe timing domain. More specifically, where the burst separation interval (i.e., temporal separation between successive data-reception commands and thus between successive data bursts) is sufficient to accommodate complete strobe postamble and preamble waveforms, the reference-domain gate-enable signal is selected to identify (or qualify) the preamble feature that triggers gate signal assertion. By contrast where the burst separation interval is too brief for complete strobe postamble/preamble, the postamble and preamble waveforms are merged into a briefer "interamble" waveform and the strobe-domain gate-enable signal is selected to prevent the interamble features from propagating through to the gated DQS signal. By this arrangement, extended intervals without data reception (and for which no strobe-domain timing edges are available) are accommodated by reference domain strobe-feature qualification (extending the search for the strobe feature over an interval sufficient to accommodate worst case skew), while bursts spaced so closely as to lack sufficient time for reference domain strobe-feature qualification over worst-case skew are accommodated by strobe domain feature qualification. Also, in a number of embodiments, the strobe-domain feature qualification mechanism is implemented by a queue or first-in-first-out (FIFO) buffer that also qualifies subsequent strobe-edge toggles (strobe-signal toggles that follow the initial active toggle) as active or inactive, deasserting the gating signal after the final active toggle. Various other embodiments discussed below accommodate a variety of system-specific burst lengths and/or ranges of burst lengths, strobe characteristics (varying number of preamble toggles, preamble duration, etc.).

Figure 1:
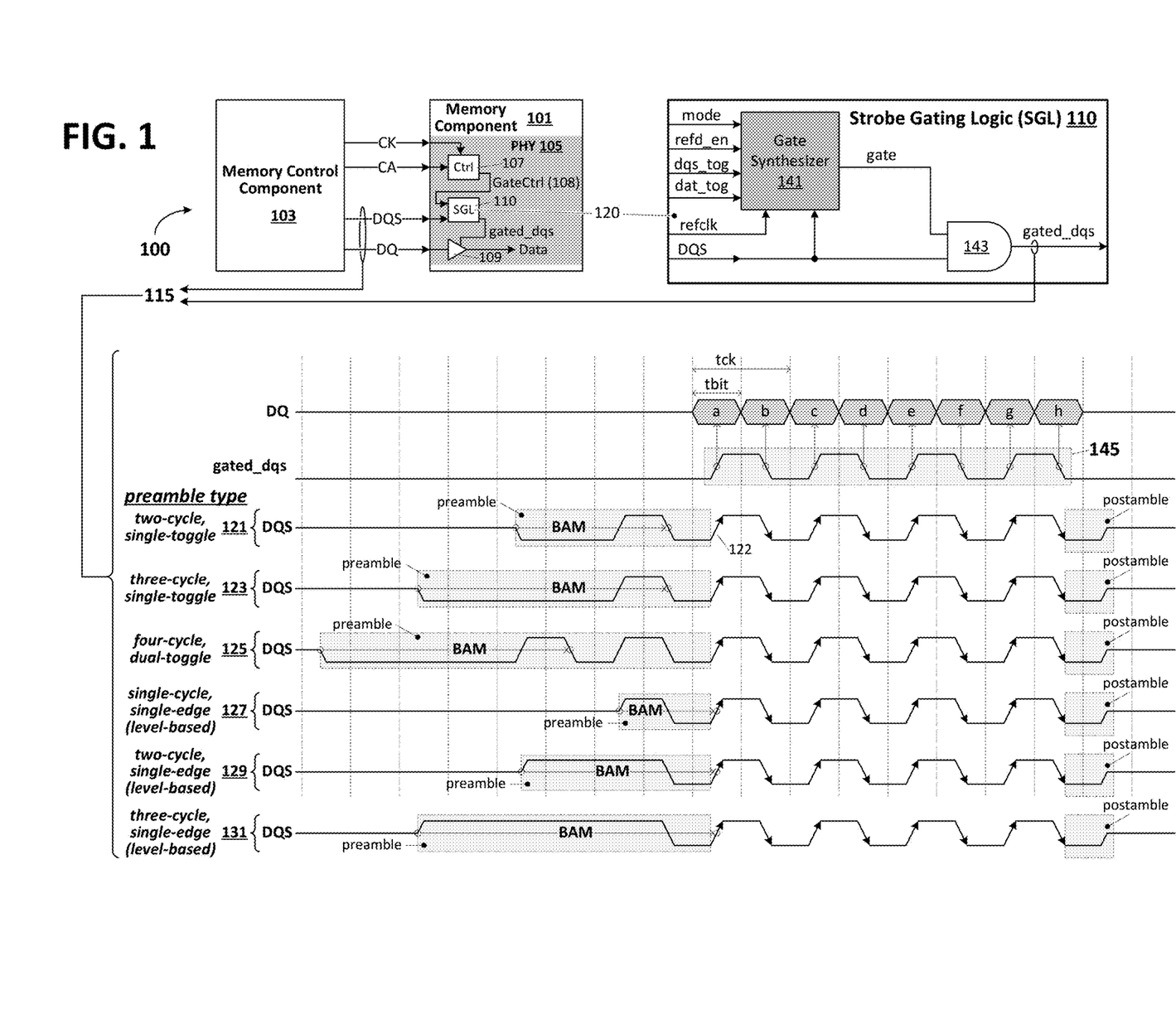
FIG. 1 illustrates a generalized embodiment of a chip-to-chip signaling system in which an integrated-circuit (IC) memory component implements adaptive strobe gating to receive strobe-timed data signals from an integrated-circuit memory control component.

FIG. 1 illustrates a generalized embodiment of a chip-to-chip signaling system 100 in which an integrated-circuit (IC) memory component 101 implements adaptive strobe gating to receive strobe-timed data signals from an integrated-circuit memory control component 103. In the particular example shown, control component 103 generates a system clock signal which establishes a controller timing domain and which is forwarded to the memory component via clock link, CK, to establish a local ("reference") clock domain therein. The memory component (e.g., DRAM, SRAM, Flash Memory or any other practicable data storage IC) receives command/address information from controller component 103 via one or more command/address links (CA) and, in association with memory write commands at least, receives data (e.g., "write data") from the controller component via one or more data links (DQ) and an accompanying strobe signal via strobe link (DQS). To simplify discussion of strobe-to-data timing relationships, a single DQ/DQS link pair is shown, though numerous DQ links may be present, with a separate DQS link for every N DQ links (where N=1, 2, 4, 8, or any other practicable number). Further, the adaptive gating circuitry and operations therein are described in the context of a memory system/memory subsystem, focusing specifically on data reception and strobe gating within memory component 101. In all cases, counterpart strobe gating circuitry and control circuitry may be implemented within control component 103 (e.g., to gate a data strobe signal transmitted by memory component 101 to time reception of an associated read data transmission). More generally, the techniques and embodiments presented herein may be implemented in any strobe-timed chip-to-chip signaling arrangement.

Still referring to FIG. 1, memory component 101 includes, as part of a physical signaling interface 105 (PHY), control circuitry 107 together with a synchronous signal receiver 109 and strobe gating logic 110. Control circuitry 107 includes a clock tree or other clock distribution circuitry to generate multiple instances of the incoming system clock (i.e., received via link CK), supplying those nominally phase-aligned "reference" clock signals to the memory core, command/address receivers and other control circuitry to establish a reference (local) clock domain within the memory component. In a number of embodiments, the clock distribution circuitry lacks circuitry to compensate for temperature/voltage-sensitive propagation time from clock input to clock output, resulting in an arbitrary and time-varying phase offset between the incoming system clock and the reference clock domain and thus between the clock domains of memory component 101 and control component 103 (In other embodiments, clock latencies may be controlled by PLL/DLL or other timing compensation circuitry, with mesochronous timing domain skew present but relatively static). Further, as write data and associated timing strobe are sourced by circuitry operating in the controller clock domain, the time-varying skew between the timing domains of the two chips yields, within the memory component, a time-varying skew between the reference clock domain and the data/strobe ensemble—skew that may exceed one or more bit times (data valid intervals) and thus complicate memory component framing of the strobe-gating signal.

Complicating matters further, strobe preamble and/or postamble waveforms vary according to system implementation or operating mode as shown for example and without limitation (and together with the gated strobe signal "gated_dqs" and an exemplary 8-bit data burst) at 115. In the presented examples, preamble types may be classified according to their duration (e.g., specified in cycles of the reference clock, not shown) and fiducial features—the latter generally being one or more toggles that precede the first active-edge toggle or, in some cases, a single edge and ensuing logic level that precede the first active-edge toggle. Strobe waveforms may vary in other regards—for example, parking (idling at inactive) at a high or low logic level rather than the mid-level shown. The different preamble types may also be associated with varying skew tolerance requirements, referred to herein as the burst arrival margin (i.e., "BAM"—the time window over which the strobe/data ensemble may drift relative to the local clock domain), generally with longer preambles associated with greater skew tolerance (larger burst-arrival margins). In the specific examples shown, for instance, the two-cycle/single-toggle preamble at 121 (i.e., preamble duration is two reference clock cycles or "2tck" and toggles once from low to high to low before the first active strobe edge 122) has a 1.5tck burst arrival margin (3tbit, where tbit is the bit time interval in a double-data rate transmission), meaning that the strobe/data ensemble may drift by ±0.75tck relative to a midpoint of the burst arrival margin. By contrast, the three-cycle/single-toggle preamble at 123 has a 2.5tck burst arrival margin and thus may drift forward (advance or skew-) by an additional 0.5tck and backward (delay or skew+) by an additional 0.5tck relative to the BAM midpoint. The four-cycle/dual-toggle preamble at 125 also has a 2.5tck burst-arrival margin, but a different BAM midpoint as the falling edge of the first of the two preamble toggles defines the outer BAM edge.

The last three strobe waveforms at 127, 129 and 131 are characterized by single-edge preambles (no full toggle) of single-cycle, two-cycle (2tck) or three-cycle (3tck) duration, respectively. In these three cases, the preamble begins with a transition from a parked state to logic high, followed by a single full transition (the "single edge" from high to low) to a logic low state just prior to the first active edge of the strobe waveform. The burst arrival margins for these single-edge preambles extend from the initial transition away from the mid-level parking to the first active strobe edge and are thus coextensive with the preamble durations (1tck, 2tck or 3tck in the examples shown). Note that level-based preambles may have one or more toggles after the first low period. In those cases, the burst arrival margin extends from the initial transition away from the mid-level parking to the first rising edge of the strobe signal—a rising edge that will be part of a preamble toggle rather than the initial data toggle shown in waveforms 127, 129 and 131. Accordingly, the single-edge preamble waveforms at 127, 129 and 131 belong to a more general class of "level-based" preambles in which the feature that concludes the burst arrival margin is a logic level following the first full signal transition (i.e., between logic high and logic low levels)—typically the logic-low level following the first high-to-low preamble transition.

Still referring to FIG. 1, an exemplary high-level (conceptual) implementation of strobe gating logic 110 is depicted in detail view 120. A gate synthesizer circuit 141 generates (synthesizes) a strobe-gating signal ("gate")—applied in a logic-AND 143 with the incoming strobe signal DQS to yield a gated strobe signal ("gated_dqs") containing only active strobe edges as shown at 145—in accordance with reference-domain control signals and local and strobe timing domains, the latter conveyed by a reference clock signal (refclk) and the inbound strobe signal itself. The reference-domain control signals include a reference-domain strobe-enable signal (refd_en) together with signals indicative of total expected strobe toggles per data burst (i.e., assuming a complete preamble and postamble) and total active-edge toggles per data burst, dqs_tog and dat_tog, respectively. In a number of embodiments, gate synthesizer 141 also receives a mode signal that specifies information bearing on gating signal assertion and deassertion including for example and without limitation, preamble type (edge-based/level-based active-edge indication, number of toggles, etc.), postamble type, data burst length, etc.

Figure 2:
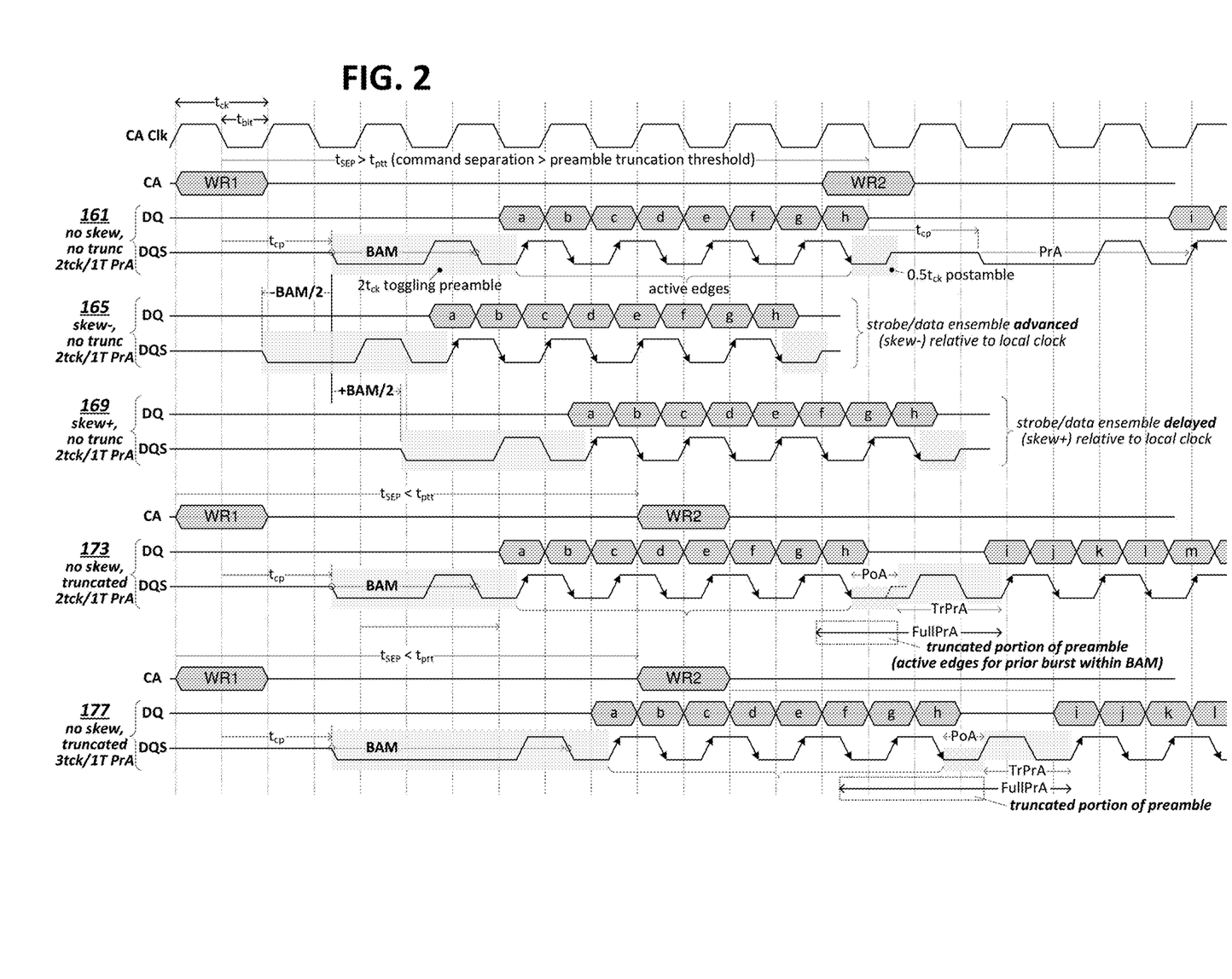
FIG. 2 illustrates various characteristic waveforms that may be conveyed to the memory component of FIG. 1 via DQ and DQS signaling links under different burst-separation and skew conditions.

FIG. 2 illustrates various characteristic waveforms that may be conveyed to memory component 101 via the DQ and DQS signaling links under different burst-separation and skew conditions. As shown, a memory write command (WR1) arriving via the command/address links (and sampled at times indicated by transitions of a command/address sampling clock ("CA Clk")) is followed by arrival of a write data burst (bits a-h) via data link DQ and corresponding data strobe via link DQS (the data burst and strobe signal collectively forming a strobe/data ensemble) a nominal time later, plus or minus a clock-to-strobe domain skew. In the example shown at 161, the strobe/data ensemble arrives without skew (i.e., exactly at the nominal arrival time after a command-to-preamble delay $t_{cp}$), while the examples at 165 and 169 show the same strobe/data ensembles arriving with maximum permissible timing skew early or late relative to the nominal arrival time—advanced and delayed by half the burst-arrival margin (BAM/2) which, in this 2tck preamble single-toggle preamble example is ±0.75tck. Note that the command/address clock and the reference clock (refclk) supplied to gate synthesizer 141 of FIG. 1 are mesochronous in one embodiment, having an arbitrary phase offset relative to one another according to their respective calibrations (e.g., CA Clk aligned with middle of received command/address eye, and refclk aligned with nominal BAM midpoint). Embodiments presented below (e.g., in FIG. 8) may show, for ease of understanding, command/address eye alignment with clock edges that are also aligned with the nominal BAM midpoint (i.e., alignment between the CA Clk and refclk domains). In all cases such alignments may be shifted by an arbitrary phase offset according to the phase offset between CA Clk and refclk.

In all three cases shown at 161, 165 and 169, a second write command (WR2) follows the first write command with a separation interval $t_{sep}$ greater than a preamble truncation threshold ($t_{ptt}$). That is, the time between successive write command arrival/sampling—and thus between arrival of successive data bursts—exceeds a minimum burst separation interval needed to accommodate non-overlapping postamble/preamble waveforms (i.e., the postamble of the strobe corresponding to WR1 does not overlap in time with the preamble of the strobe corresponding to WR2) so that no preamble truncation occurs. Conversely, in the waveform shown at 173, write-command (and data burst) separation is briefer than the preamble truncation threshold (less than the minimum burst separation interval) so that the postamble corresponding to WR1 and preamble corresponding to WR2 overlap and merge with one another—yielding an incomplete postamble/preamble waveform referred to herein as an interamble. In the specific example shown, the preamble is truncated to a duration TrPrA instead of extending for the full duration, FullPrA. A second interamble scenario is shown at 177 in the context of a 3tck/single-toggle preamble. In a number of embodiments, the strobe-sourcing component (the control component in this write-data example) manages the interamble waveform (knowing a priori that the command separation is insufficient to accommodate a full postamble/preamble) to avoid runt pulses or other glitches, but with potential loss of fiducial toggles or edges within the preamble. Embodiments of the strobe gating logic discussed herein account for loss of fiducial strobe features, reverting to alternative toggle qualification circuitry to ensure correctly timed assertion/deassertion of the strobe gating signal.

Figure 3:
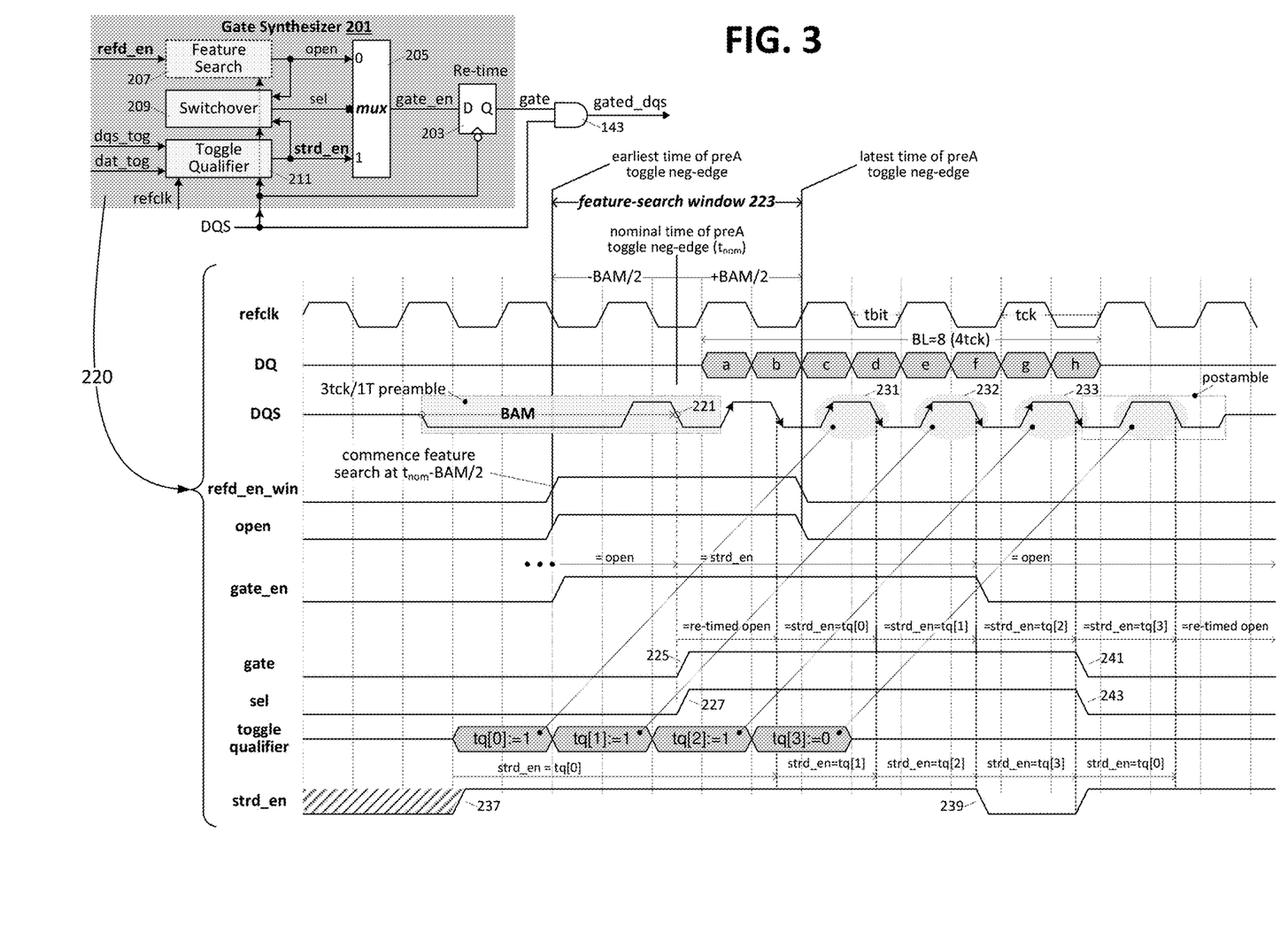
FIG. 3 illustrates a conceptual embodiment of a gate synthesizer circuit intended for operation with a toggling preamble and that may be used to implement the gate synthesizer shown in FIG. 1.

FIG. 3 illustrates a conceptual embodiment of a gate synthesizer circuit 201 intended for operation with a toggling preamble and that may be used to implement gate synthesizer 141 of FIG. 1. In the depicted implementation, a re-timing flop stage 203 establishes the state of the gate signal (gate) at every falling edge of the incoming strobe signal (DQS) in accordance with a gate-enable signal (gate_en) supplied from one of two control sources via enable-source multiplexer 205. More specifically, prior to a full-preamble data burst multiplexer 205 passes a gate-open signal (open) from a reference-domain-controlled feature-search block 207 as the gate-enable signal in response to a low enable-select signal (sel), and then, after a switchover circuit 209 transitions the enable-select signal from low to high, passes a strobe-domain enable signal (strd_en) from a toggle qualifier circuit block 211. In a number of embodiments, switchover circuit 209 raises the enable-select signal in response to open signal assertion, latching enable-select high until toggle qualifier 211 drives the strobe-domain enable signal low to indicate that all active strobe toggles have been passed to the gated strobe (gated_dqs) output.

In the FIG. 3 implementation, toggle qualifier 211 pre-qualifies each toggle of the strobe signal as active (data sampling edges to be passed into gated_dqs) or inactive (overhead, not to be passed through to gated_dqs) in response to reference domain timing edges, outputting those toggle qualifications at respective times indicated by subsequent transitions of the data strobe signal. In a number of embodiments, for example, qualification values corresponding to toggles expected in the strobe signal (anticipated or predicted toggles) are queued within a first-in-first-out (FIFO) storage in response to reference clock edges and then read out of the FIFO in response to respective (and subsequent) strobe edges, thus achieving a timing-domain crossing (bridging the skew) in which each read-out qualification value serves as the strobe-domain enable signal (strd_en). Accordingly, upon switching the gate-enable source from the feature-search output to the toggle qualifier output, gate-enable is maintained until the penultimate active strobe toggle transpires, and then lowered at that point so that the gate signal itself is lowered (by re-timing flop stage 203) in response to the falling edge of the final active strobe toggle.

Still referring to FIG. 3, toggle qualifier 211 receives a pair of control signals that indicate, by virtue of assertion duration, the total number of strobe toggles expected in association with a given data burst (overhead toggles plus active toggles and thus a signal assertion duration dependent on preamble type and burst length) and the total number of active strobe toggles expected in association with the data burst—that is, a strobe-toggle control signal (dqs_tog) and a data-toggle control signal (dat_tog), respectively. As explained in further detail below, strobe-toggle control signal controls the number of toggle qualification values loaded into the toggle-qualifier FIFO for a given data-receive event, while the data-toggle control signal establishes the logic state of each queued data qualification value, an arrangement that produces deterministic deassertion of the strobe-domain enable signal strd_en at the falling edge of the penultimate active strobe toggle.

Timing diagram 220 of FIG. 3 illustrates exemplary signal waveforms generated within the gate synthesizer 201 for an eight-bit data burst accompanied by a three-cycle, single-toggle preamble. In the example shown, the strobe/data ensemble is illustrated with a nominally ideal timing relationship with respect to the reference clock domain—that is, with the falling edge of the preamble toggle 221 is centered at time $t_{nom}$ within a feature-search (skew-tolerance) window 223 that opens a predetermined number of reference clock edges after write command reception (not specifically shown) and remains open for an interval equal to the burst arrival margin for the subject preamble (i.e., a 2.5tck interval in the 3tck/single-toggle preamble case shown). The feature-search window is illustrated with respect to the strobe preamble feature (falling edge 221 of single preamble toggle) that times the initial gate signal assertion—that is, the preamble feature effectively searched for by assertion of the reference-domain enable signal which, in this specific example, is a windowed signal ("refd_en_win") that passes through feature search block 207 without change as the "open" signal (i.e., feature-search block 207 may be deemed to be omitted or as a transparent circuit for the single-toggle preamble type shown). Accordingly, the reference-domain enable signal (and thus the open signal) is raised at the start of the feature-search window and closed at the end of the feature-search window (i.e., at the nominal transition point of the negative edge of the preamble toggle plus or minus BAM/2), passing through enable-source multiplexer 205 (enable-select signal is initially low) to ensure that a falling toggle edge anywhere in that search window will trigger assertion of the gate signal at the output of flop stage 203 (as shown at 225), thus deterministically raising the gate signal a predetermined interval (0.5tck or tbit) ahead of the first active strobe edge. Switchover circuit 209 detects the falling preamble edge 221 during feature search (i.e., both the strobe signal and open signal are supplied to switchover circuit 209) and responsively raises the enable-select signal at 227, switching the gate-enable source from the open signal to the strobe-domain enable signal (which is high at the switchover point as discussed below) and latching the enable-select signal until both the open signal and the strobe-domain enable signal are sampled low by a subsequent falling strobe edge.

The strobe-toggle and data-toggle control signals are raised at predetermined times prior to $t_{nom}$ to enable toggle qualification values to be loaded into a FIFO storage within toggle-qualifier 211. In the specific example shown at 220, single-bit qualification values are loaded into FIFO storage elements tq[0], tq[1], tq[2] and tq[3] in successive reference clock cycles to qualify the four strobe toggles expected after the first active toggle. That is, logic '1' (toggle-enabling) values stored within FIFO elements tq[0], tq[1] and tq[2] to yield a logic-high strobe-domain enable signal at the FIFO output ahead of the three active toggles (231, 232, 233) that follow the first active toggle (i.e., driving strd_en high at 237 to maintain gate signal assertion during each of those toggles), while a logic '0' (toggle-disabling) value stored within FIFO element tq[3] drives the strobe-domain enable signal low at 239 after the penultimate active toggle 232, causing the gate signal to go low at 241 following the final active toggle 233 and thus lowering the gate signal upon passing the final active strobe edge.

Still referring to timing diagram 220 of FIG. 3, the low strobe-domain enable signal following the penultimate active toggle also resets a select-signal latch within switchover circuit 209, thereby driving the enable-select signal low at 243 so that toggle qualifier 211 no longer drives the gate enable signal (driven instead by the reference-domain enable signal which is held low until a subsequent data burst is expected).

Figure 4:
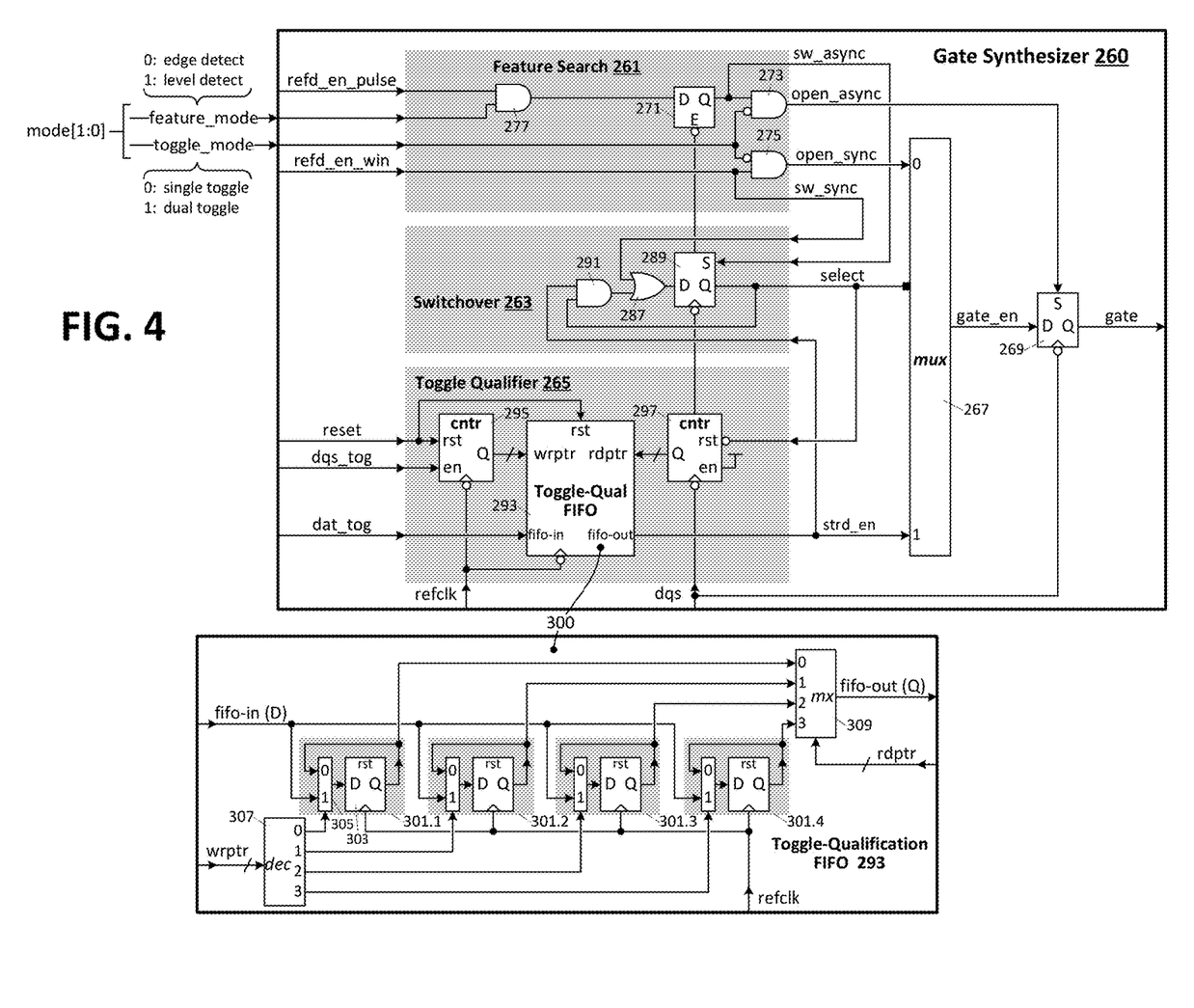
FIG. 4 illustrates a more detailed embodiment of a gate synthesizer having feature-search, switchover and toggle-qualifier components together with an enable-select multiplexer and re-timing flop stage.

FIG. 4 illustrates a more detailed embodiment of a gate synthesizer 260 having feature-search, switchover and toggle-qualifier components (261, 263, 265) corresponding to those discussed above, together with an enable-select multiplexer 267 and re-timing flop stage 269. In the depicted example, gate synthesizer receives a 2-bit mode signal having feature mode and toggle mode component signals that enable (i) selection between level-based and edge-based feature detection ("feature_mode") and (ii) selection between single and dual preamble toggle types ("toggle_mode"). In alternative embodiments, the toggle count can be extended to specify more than two toggles, applying the general principles explained below for dual toggle operation (e.g., circuitry to selectively defer gate signal assertion as necessary to account for any practicable number of preamble toggles). Gate synthesizer also receives a reference domain enable signal having separate pulsed and windowing component signals shown as refd_en_pulse and refd_en_win, respectively. In the depicted embodiment, the pulsed reference-domain enable signal is asserted (e.g., pulse duration equal to a reference clock cycle) when the feature_mode indicates level-based detection and is undriven otherwise, while the windowed reference-domain enable signal is driven in both level-based and edge-based feature modes, serving as a gate turn-off indicator for both feature modes and as a gate turn-on trigger during edge-based feature mode.

Continuing with the FIG. 4 embodiment, feature search circuit block 261 includes a transparent latch 271 together with logic gates 273, 275 and 277 (the latter being optionally omitted where upstream logic circuitry holds refd_en_pulse low during edge-detect operation). In level-detect operation (feature_mode=1), the pulsed reference-domain enable signal is asserted (e.g., for a reference clock cycle) to enable detection of a low level of the DQS signal. More specifically, the reference-domain enable pulse propagates through gate 277 (which may be omitted where upstream logic holds refd_en_pulse low during edge-detect mode) to transparent latch 277, passing through the latch asynchronously while incoming strobe signal (dqs) is low to drive an asynchronous switchover signal (sw_async) and an asynchronous gate-open signal (open_async). The asynchronous gate-open signal is supplied to an asynchronous set input of flop stage 269 ('S') to drive the output of that flop-stage high in response to detection of the low level of the strobe signal and thereby assert the gate signal ("gate") ahead of the first active strobe edge. The asynchronous switchover signal is supplied to an asynchronous set input of flop stage 289 within switchover component 263, raising the output of that flop stage (i.e., enable-select signal, "select") to switchover, within multiplexer 267, the source of the gate-enable signal (output of multiplexer 267, synchronous signal input to flop stage 269) from feature search component 261 to toggle qualifier 265. As explained below, toggle qualifier 265 is preloaded with one or more toggle qualification values that will yield a logic high strobe-domain enable output (strd_en) prior to assertion of the enable-select signal (and thus prior to assertion of refd_en_puls) so that the switchover via multiplexer 267 will yield a logic high gate-enable signal prior to the first active dqs edge, thereby maintaining the gate signal assertion following the first active strobe toggle in accordance with predicted strobe toggles.

Where the incoming mode signal indicates a dual toggle (two toggle) level-based preamble feature search (i.e., toggle mode=1), the asynchronous open signal is held low by logic gate 273 while the asynchronous switchover signal is asserted to drive the enable-select signal high and thereby switch over to toggle qualifier 265 as the source of the gate_enable signal. By this operation (and by preloading the toggle qualifier so that strobe-domain enable is asserted at switchover), the high state of the strobe-domain enable signal (propagating through multiplexer 267 to drive gate_enable high) is clocked into re-timing flop 269 at the ensuing falling edge of the strobe, effectively delaying the gate signal assertion by one dqs cycle and thus deferring gate signal assertion to account for the extra dqs preamble toggle. Additional flop-stage delays may be multiplexed into the enable-select assertion path in other embodiments to delay switchover for one or more additional dqs cycles to account for additional strobe preamble toggles.

In edge-detect, single-toggle_mode (feature_mode=0, toggle_mode=0), the windowed reference domain enable signal (refd_en_win) is asserted to raise the synchronous open signal (open_sync) and thus raise gate_enable prior to assertion of the enable-select signal (i.e., prior to switchover to the toggle qualifier). By this operation, the falling edge of the solitary strobe-preamble toggle will clock the high gate-enable through to the gate signal, raising the gate signal in preparation for the active strobe edges to follow. The refd_en_win assertion also drives the input to switchover flop 289 high (i.e., via OR gate 287) so that the enable-select signal is raised to switchover the gate-enable signal source by the same strobe preamble falling edge that drives the gate signal high. Thus, the gate signal is kickstarted high ahead of the first active strobe edge by feature search component 261 and thereafter maintained in accordance with the strobe-domain enable signal from toggle qualifier 265.

In edge-detect, dual toggle_mode (feature_mode=0, toggle_mode=1), the synchronous open signal is held low by the high state of the toggle-mode signal (i.e., suppressed via AND gate 275), thus deferring gate-enable assertion by one strobe cycle (i.e., via select signal assertion within switchover circuit 263) to account for the added preamble toggle. As in level-detect mode, additional flop-stage delays may be multiplexed into the select-signal assertion path to delay switchover (i.e., delay enable-select signal assertion) for one or more additional strobe cycles to account for additional strobe preamble toggles.

Still referring to FIG. 4, toggle qualifier 265 asserts the strobe-domain enable signal for each active strobe toggle that precedes the final active toggle and thus, by virtue of the logic AND of the enable-select signal and strobe-domain enable signal in gate 291 and passage of the logic AND output to OR gate 287, effectively latches the enable-select signal high until the final active strobe edge. That is, when toggle qualifier 265 drives the strobe-domain enable signal low ahead of the final active toggle, the output of logic AND gate 291 goes low so that, if the open signal is also low, the final active strobe edge (falling strobe edge) will clock the low output of OR gate 287 to the output of flop stage 289, lowering the enable-select signal in preparation for a subsequent preamble feature search. As discussed below, in cases where burst-separation interval is too brief to ensure preamble feature detection (i.e., potential failure of feature search due to postamble-to-preamble interference), the reference-domain enable signal may be asserted throughout the multi-transaction interval, thereby maintaining the high-state of the enable-select signal across two or more data burst receptions and thus enabling toggle qualifier 265 to qualify all active toggles for data bursts that follow the initial feature-searched data burst.

Continuing with FIG. 4, toggle qualifier 265 includes a toggle-qualification FIFO 293 (or queue) together with write and read counters 295 and 297 that generate, as respective count outputs, a FIFO write pointer ("wrptr") and a FIFO read pointer ("rdptr"). In the depicted embodiment, write counter 295 is clocked by falling edges of the reference clock signal and thus, whenever enabled (i.e., by assertion of the strobe-toggle control signal, dqs_tog), advances the write pointer in response to negative (falling) reference clock edges. Read counter 297, by contrast, is clocked by falling edges of the incoming strobe signal, advancing the FIFO read pointer through values that track those of the write pointer (i.e., refclk-domain loading of qualification bits occurs prior to strobe-domain readout of those bits) whenever enabled by the high-state of the enable-select signal. Prior to a preamble feature-search operation, a reset signal is asserted to initialize (e.g., to zero) the FIFO contents and the write counter, aligning the write and read pointers (the latter being enabled by select signal assertion) to make ready for qualification-bit load and subsequent unload.

Toggle qualification FIFO 293 is also clocked by reference clock (negative edges in the example shown) and receives the data-toggle control signal (dat_tog) at its load (data-in) input and thus, as the write pointer is advanced, loads the state of the data-toggle control signal ('1' or '0') into successive FIFO storage elements. As the read pointer is advanced by successive falling strobe edges, the pre-loaded FIFO storage elements are selected in succession to drive the strobe-domain enable output. Accordingly, qualification values are successively pre-loaded into the FIFO in the reference clock domain and then successively output in the strobe timing domain, with each output qualification value sustaining or lowering the strobe-domain enable signal so as to maintain gate signal assertion until the final active strobe edge.

Toggle qualification FIFO 293 is generally implemented with a number of qualification-bit storage elements to accommodate worst-case timing latency from refclk-domain element load to strobe-domain element unload—four storage elements 301 (301.1, 301.2, 301.3 and 301.4) in the exemplary implementation shown in detail view 300, though more or fewer storage elements may be provided in alternative embodiments. As shown, each qualification-bit storage element 301 includes a flip-flop 303 clocked by the reference clock signal and a load multiplexer 305 to supply, to the input of flop 303, either the FIFO data input (i.e., "fifo-in"—the dat_tog signal) or the value output from flop 303, thereby effecting either a load operation or a data-hold (maintaining same data state) operation at each reference clock cycle. The incoming write pointer—a two-bit value in this example—is decoded by 2:4 decoder 307 to drive one of four load-multiplexer control signals high, thus selecting one of the four storage elements 301.1-301.4 to be loaded with the FIFO-in data value during each clock cycle, while the remaining three storage elements hold their state. A read-out multiplexer 309 passes one of the four qualification bits (outputs from respective storage elements 301.1-301.4) as the FIFO output (i.e., strobe-domain enable signal) in accordance with the read pointer—also a two-bit value in this example. Though not specifically shown in detail view 300, the reset signal is supplied to reset inputs of flops 303 to reset the FIFO contents (e.g., to logic '0' states) whenever the read and write counters are reset.

The specific signal interconnections, component counts, reset states and so forth shown in FIG. 4 may be varied in alternative embodiments. In one embodiment, for example, toggle-qualification FIFO 293 includes more or fewer qualification-bit storage elements in accordance with larger or smaller skew tolerance required in a given signaling application. In another embodiment, contents of toggle-qualification FIFO 293 are reset to a logic '1' state (instead of the logic '0' state shown) and the read pointer enable/reset controls are altered (e.g., enable tied high, while the reset input receives an inverted version of the open signal) so that read-pointer 297 advances (starting from zero, modulo FIFO depth) in response to DQS falling edges only while the open signal is asserted.

Figure 5A:
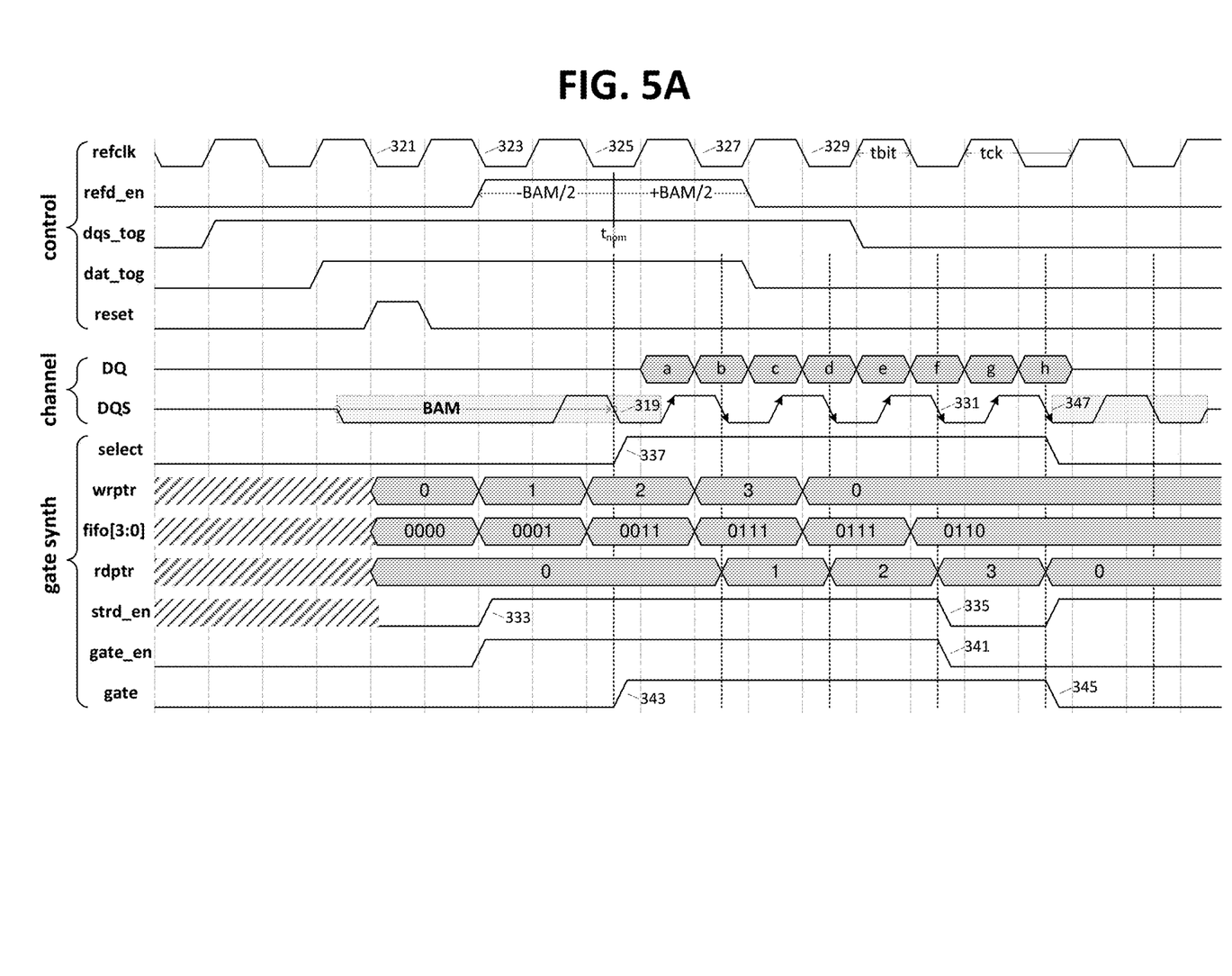
FIG. 5A illustrates exemplary control signal waveforms, channel waveforms and gate synthesis waveforms corresponding to the FIG. 4 gate synthesizer under nominal timing conditions for a single-toggle, three-cycle preamble.

FIG. 5A illustrates exemplary control signal waveforms, channel waveforms (i.e., data signals and data strobe signal) and gate synthesis waveforms corresponding to the FIG. 4 gate synthesizer under nominal timing conditions for a single-toggle, three-cycle preamble—that is, with the falling edge 319 of the preamble toggle aligned with $t_{nom}$, midway within the permissible skew range. As shown, the strobe-toggle control signal (dqs_tog) is asserted a predetermined time prior to the $t_{nom}$ (a predetermined number of clock cycles after receipt of a command associated with the write data burst) for a duration equal to the total number of toggles expected in the strobe waveform—in this case six cycles to match the preamble toggle, four active toggles and post-amble toggle. The data-toggle control signal (dat_tog) is asserted one cycle after the strobe-toggle control signal for a duration equal to the number of active toggles (four reference clock cycles in this 8-bit burst example), thereby centering dat_tog within the dqs_tog assertion interval in the specific example shown. The reset signal is asserted a half cycle after the data-toggle signal at clock edge 321, thereby driving the write pointer and read pointer values to zero and initializing the contents of the qualification FIFO (i.e., qualification bits fifo[3:0]) to '0000', where the rightmost bit is the content of fifo[0] (storage element 301.1 in FIG. 4) and the leftmost bit is the content of fifo[3] (storage element 301.4 in FIG. 4). The reference-domain signal—in this case the windowed reference-domain enable signal discussed above—is asserted one cycle after the reset signal to open the feature-search window at $t_{nom}$–BAM/2.

Turning now to the gate synthesizer signals, the enable-select signal ("select") is initially low (e.g., by virtue of competition of a prior burst cycle, or in response to a reset event) so that gate_enable (the output of enable multiplexer 267 in FIG. 4) goes high with the reference-domain enable signal (refd_en) at falling refclk edge 323. That same reference clock edge loads fifo[0] with a logic '1' qualification bit and advances the write pointer to point to fifo[1]. Ensuing reference clock edges at 325 and 327 likewise load logic '1' qualification bits into fifo[1] and fifo[2], respectively (advancing the write pointer in each case), with the subsequent reference clock edge (329) occurring after the data-toggle control signal has gone low, thus loading a logic '0' qualification bit into fifo[3]. By this operation, the qualification FIFO effectively predicts the three active toggles (in fifo[0], fifo[1] and fifo[2]) that follow the first active toggle (which is itself captured/passed by the feature-search-raised gate signal), and then the inactive postamble toggle (in fifo[3]=0). Accordingly, the strobe-domain enable signal, initially low following the reset at clock edge 321, goes high (333) at reference clock edge 323—i.e., when fifo[0] (the qualification-bit storage element selected for read-out by the reset-to-zero read pointer) is loaded with a logic '1' qualification bit—and remains high through successive strobe toggles until the read pointer advances to fifo[3] in response to strobe edge 331, dropping to a low state at that point as shown at 335. The high-going strobe-domain enable at 333 sustains the high state of gate-enable signal after switchover (i.e., when the enable-select signal goes high at 337 in response to detection of falling edge 319 of the preamble toggle), and the falling strobe-domain enable at 335 drives gate-enable low as shown at 341. The re-timing flop stage (element 269 in FIG. 4) drives the gate signal high at 343 (as gate_enable is high at falling strobe edge 319) and maintains the open gate until 345 (when the low state of the strobe-domain enable signal is sampled in response to the final active strobe edge 347), thereby deterministically opening and closing the gate in response to the final preamble falling edge 319 and the final active strobe edge 347, respectively.

Figure 5B:
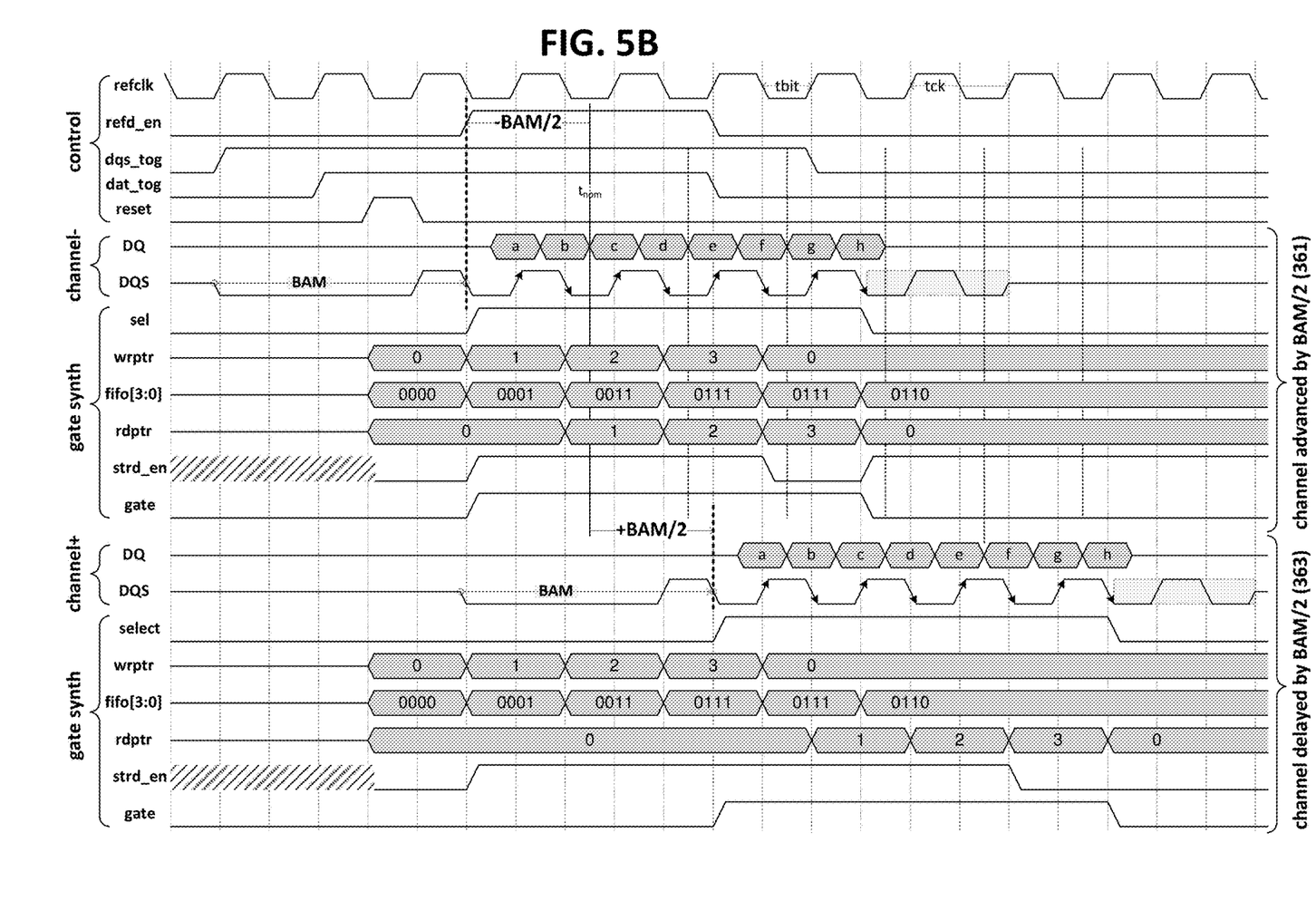
FIG. 5B illustrates the skew tolerance of the FIG. 4 gate synthesizer, showing the gate opening operation when the strobe/data ensemble is skewed to early and late extremes within the tolerable skew range.

FIG. 5B illustrates the skew tolerance of the FIG. 4 gate synthesizer, showing the gate opening operation when the strobe/data ensemble is skews to early and late extremes (361 and 363, respectively) within the tolerable skew range relative to a windowed reference-domain enable signal.

Figure 6A:
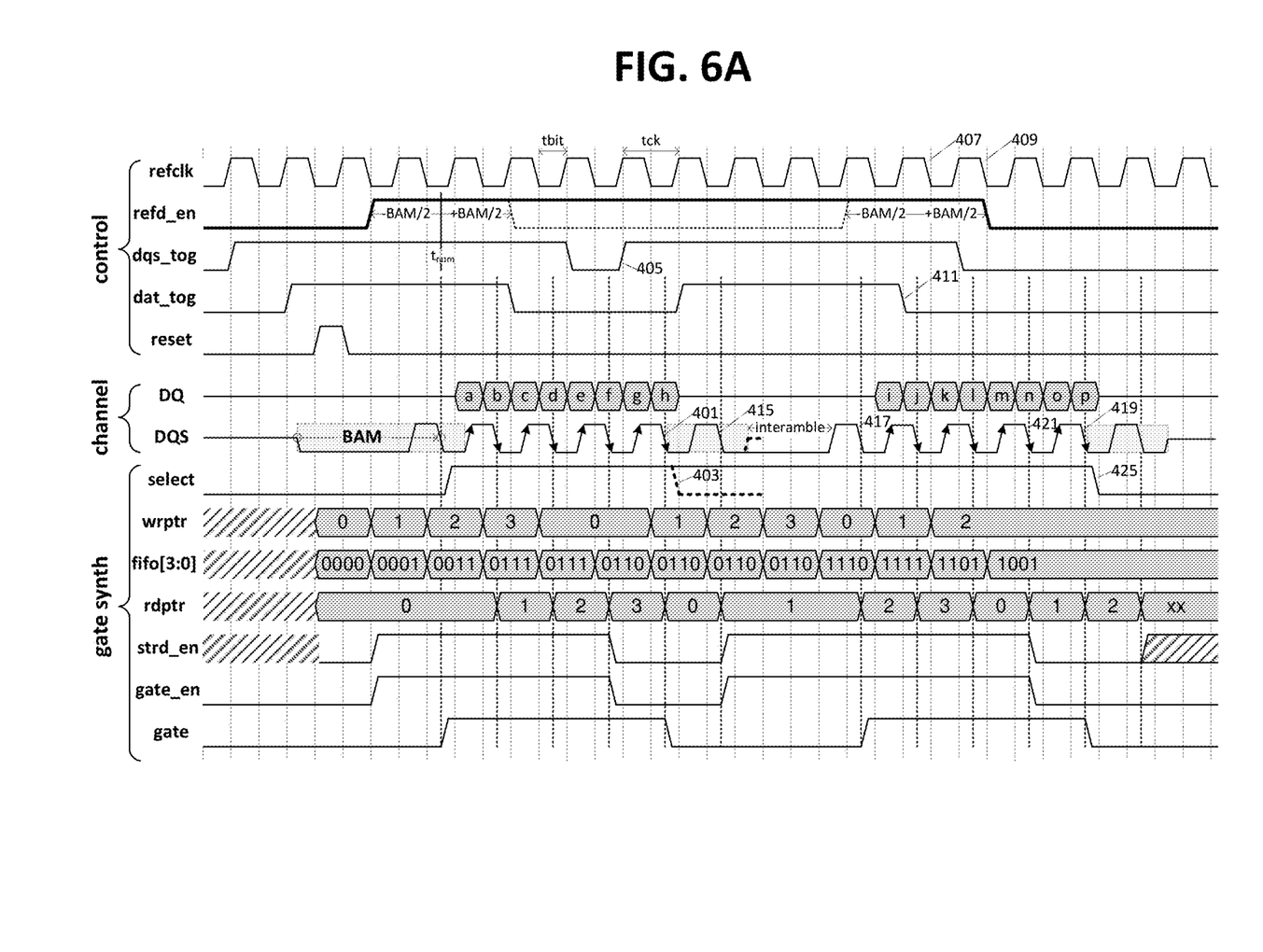
FIG. 6A illustrates exemplary operation of the FIG. 4 gate synthesizer under an interamble condition.

FIG. 6A illustrates exemplary operation of the FIG. 4 gate synthesizer under an interamble condition—when the interval between successive data bursts is briefer than required for distinct (non-concurrent, non-overlapping) strobe postamble and preamble waveforms for those data bursts. Control circuitry within the data-receiving device (e.g., element 107 of FIG. 1) detects the impending interamble by timing the separation between successive commands that indicate data reception (e.g., write commands in the case of a memory component, read commands in the case of a memory control component) and comparing the separation interval against a threshold. In one embodiment, discussed in greater detail below, the control circuitry responds to detection of an upcoming strobe interamble by (i) asserting the reset signal only prior to the first data burst and not the second, and (ii) maintaining assertion of the windowed reference-domain enable signal throughout the interamble—from the start of a discrete reference-domain-enable assertion that would otherwise accompany the first data burst to the end of a discrete reference-domain-enable assertion that would otherwise accompany the second data burst.

The gate synthesizer waveforms generated for the first data burst match those discussed above in reference to FIG. 5A until the final active strobe edge 401 samples the low state of strobe-enable signal (which has passed through the enable multiplexer to produce a low gate-enable signal). At that point the gate signal goes low as before, but the high state of the reference-domain enable signal maintains the enable-select signal high (where it would otherwise go low as shown by the dashed line at 403). Consequently, instead of commencing a new preamble-feature search (which would potentially fail due to the conflicting postamble/preamble within the strobe interamble waveform), the toggle qualifier output (strobe-domain enable) continues to qualify upcoming strobe toggles as active (logic '1' qualification bit) or inactive (logic '0' qualification bit) according to the data-toggle control signal. Thus, after the strobe-toggle control signal returns high at 405, the write pointer is advanced in successive reference clock cycles to load logic '1' qualification bits into fifo[1], fifo[2], fifo[3] and fifo[0] (i.e., as the data-toggle control signal is high during those FIFO write events) and then loads a logic '0' qualification bit into fifo[1] and fifo[2] in response to the reference clock edges (407, 409) that trail the low-going transition of the data-toggle control signal (411).

When the read pointer advances from zero to one in response to postamble falling edge 415, the logic '1' qualification bit at fifo[1] drives the strobe-domain enable signal (and thus the gate-enable signal) high so that the gate signal is driven high at the ensuing falling edge (417) of the truncated preamble. Accordingly, the gate signal goes high just ahead of the first active strobe edge and, by virtue of the qualification bits read-out from successive FIFO locations (as the read pointer is advanced to 2, 3 and then back to zero), maintained high until final active strobe edge 419 samples the low state of the strobe-domain enable signal (strd_en having been driven low upon read pointer advance in response to penultimate active negative strobe edge 421 to select the zero-valued qualification bit in fifo[1]). In absence of successive interambles, the windowed reference-domain enable signal and strobe-domain enable signals are both low at the final active strobe edge 419, causing the switchover circuit to drive the enable-select signal low as shown at 425 and thus arm the gate synthesizer for subsequent preamble feature search.

Figure 6B:
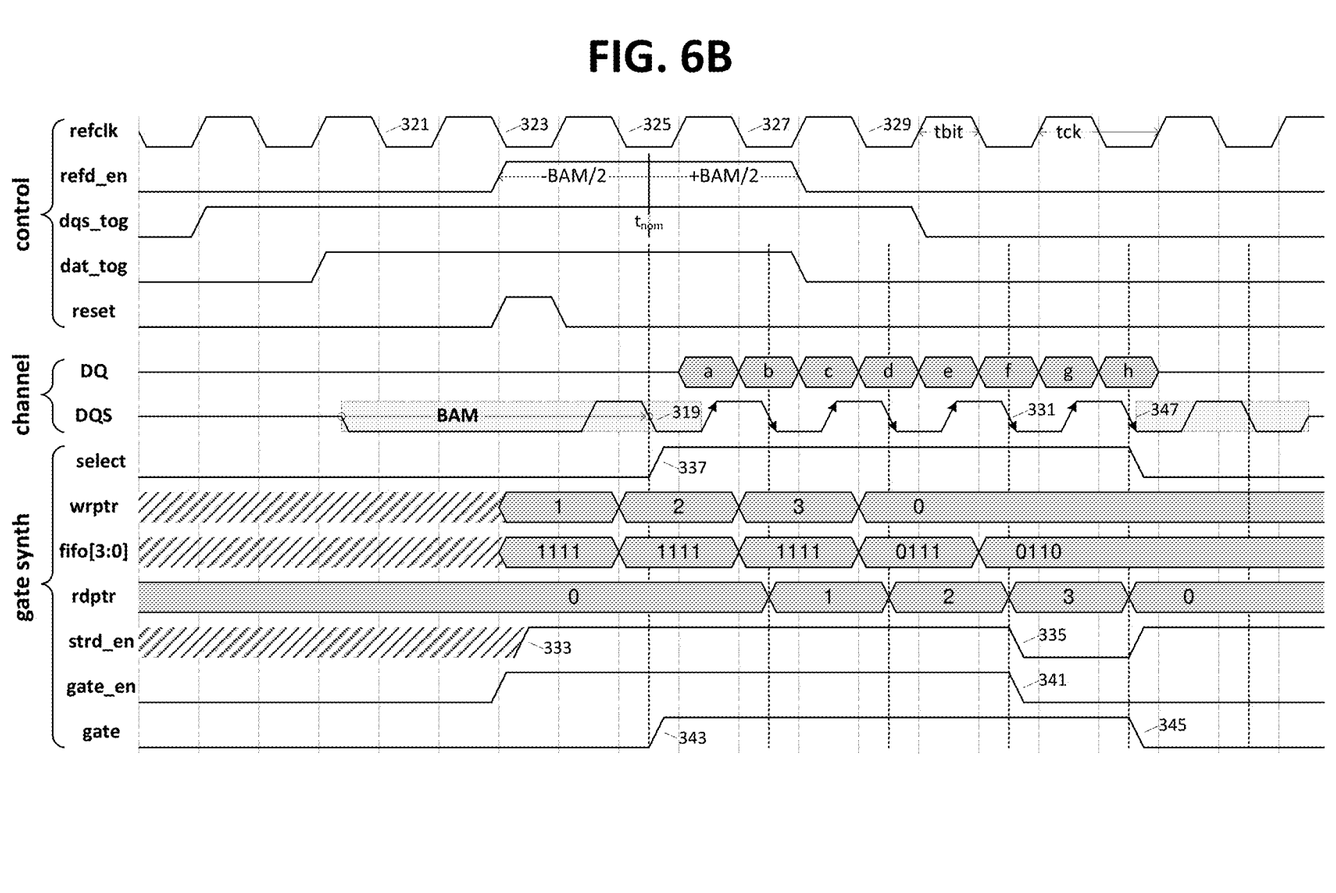
FIG. 6B illustrates an alternative operation of the FIG. 4 gate synthesizer in an embodiment that resets the write pointer and toggle qualifier content to logic '1' states instead of logic '0' states.

FIG. 6B illustrates an alternative operation of the FIG. 4 gate synthesizer in an embodiment that resets the write pointer and toggle qualifier content to logic '1' states instead of logic '0' states. Switchover and toggle qualification operations are carried out generally as described in reference to FIG. 5A (potentially with reduced latency), though cycle-by-cycle setting of toggle qualification bits (in response to refclk falling edges) for an initial data burst is not specifically evident in the depicted fifo[3:0] waveform due to the logic '1' reset states of those bits.

Figure 7:
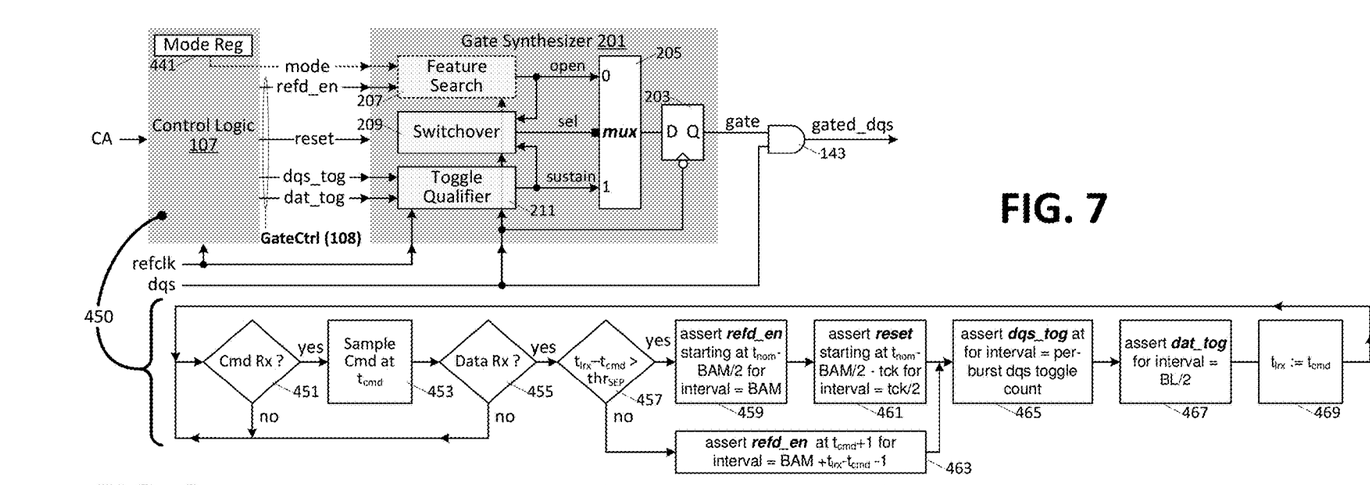
FIGS. 7 and 8 illustrate exemplary generation of the control signals supplied to enable feature-search, enable-domain switchover and toggle qualification within the gate synthesizer of FIG. 3 (or any gate synthesizer embodiments herein) under different burst-separation scenarios.
Figure 8:
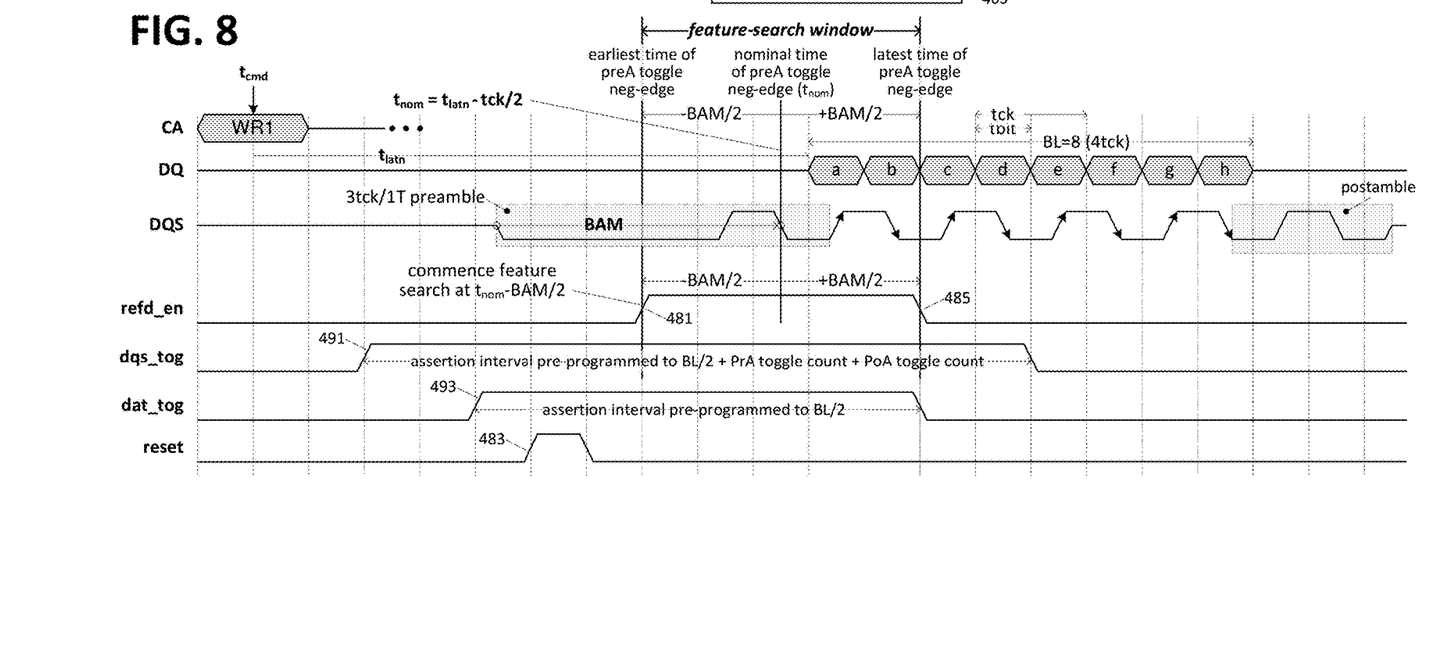

FIGS. 7 and 8 illustrate exemplary generation of the control signals supplied to enable feature-search, enable-domain switchover and toggle qualification within gate synthesizer 201 (or any gate synthesizer embodiments herein) under different burst-separation scenarios. As shown, control logic 107 is clocked by the reference clock signal (and thus operates in the reference clock domain) and outputs, as gate control signals (108), the above-discussed reference-domain enable signal (refd_en), strobe-toggle control signal (dqs_tog), data-toggle control signal (dat_tog) and reset signal (reset). In one embodiment, control logic 107 includes a mode register 441 programmed (e.g., in response to control-component or host instruction) with preamble-type information that drives the mode signal supplied to feature search block 207 within gate synthesizer 201 (and optionally to the other circuitry within control logic 107) to enable mode-specific generation of the gate control signals. In embodiments that support fewer preamble types, the mode signal output from control logic 107 to gate synthesizer 201 may be omitted. For example, in embodiments that support single-toggle preambles only, no mode signal need be output to gate synthesizer 201 and the feature-search block therein may be omitted as the reference-domain enable signal is driven directly to the enable-select multiplexer—i.e., reference-domain enable and open signals are one and the same.

Still referring to FIG. 7, and more specifically to exemplify the operational flow shown at 450, control logic 107 determines for each reference clock edge whether a command is to be received (e.g., signified within a memory component by chip-enable signal assertion, conveyance of a chip-identifier or other chip-selection approach) and, if so (affirmative determination at 451), samples the command (453) at a reference clock edge referred to herein as $t_{cmd}$. If the command indicates that a corresponding data burst is to be received within the subject IC component (affirmative determination at 455 that the command is a "data-reception" command), then the temporal separation between reception of a prior data-reception command and the current command (i.e., $t_{lrx}-t_{cmd}$, where $t_{lrx}$ is the $t_{cmd}$ time stamp for the most recently received, prior data-reception command) is compared at 457 with a burst separation threshold, $thr_{SEP}$. If the time interval between the current and prior command time stamps exceeds the burst separation threshold—an affirmative determination at 457 indicating sufficient time for non-conflicting postamble for the prior burst and preamble for the current burst—then the reference-domain enable signal is asserted starting at $t_{nom}$-BAM/2 (half the bust margin) for an interval equal to the burst arrival margin (operation shown at 459 in FIG. 7, waveform at 481 in FIG. 8), where the burst-arrival margin is determined according to the mode information from mode register 441. As discussed above, $t_{nom}$ corresponds to a timing point, centered within the skew tolerance window, at which a fiducial feature of the preamble (falling edge of single preamble toggle in this example) is expected. In the case of a single toggle or level-based preamble, for example, $t_{nom}$ occurs at the nominal data burst latency ($t_{latn}$) relative to $t_{cmd}$ less a half clock cycle and thus at $t_{latn}$-tck/2 as shown in FIG. 8.

Proceeding from operation 459 within operational flow 450, the reset signal is asserted one reference clock cycle prior to opening the search window as shown at 483 in FIG. 8 (i.e., one tck prior to assertion of refd_en) for a half-cycle duration (operation 461 of FIG. 7). Returning to the burst separation evaluation at 457, if the burst separation interval falls below the threshold necessary for complete postamble/preamble waveforms (negative determination at 457), the reset signal assertion at 461 is bypassed, and the reference-domain enable signal is asserted one cycle after $t_{cmd}$ (i.e., one cycle after registration of the current data-reception command for an interval equal to the burst separation plus the burst arrival margin less one tck—a timing that maintains assertion of the reference-domain enable signal from the opening point of the prior data-reception command to the closing point (485) for the current data-reception command so that the reference-domain enable signal remains asserted throughout an interval that spans the otherwise-discrete enable times for the two commands (i.e., as shown by the interamble example in FIG. 6A).

Continuing with operation flow 450, at 465 the strobe-toggle control signal is asserted at time 491 (FIG. 8) and maintained for an interval equal, in reference clock cycles, to the nominal number of per-burst toggles in the strobe preamble [less any number sure to be omitted due to interamble?]. The data-toggle control signal is asserted in operation 467 (i.e., at time 493 in FIG. 8 and N cycles after the strobe-toggle control signal assertion, where N is the number of preamble toggles) and maintained for a number of reference clock cycles equal to the number of active strobe toggles. At 469, the reception time stamp, $t_{cmd}$, for the current data-reception command is recorded as the reference value, $t_{lrx}$, to be applied in subsequent burst separation evaluations at 457.

The various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the, signaling characteristics (e.g., preamble types), component circuits or devices and the like can be different from those described above in alternative embodiments. Additionally, links or other interconnection between integrated circuit devices or internal circuit elements or blocks may be shown as buses or as single signal lines. Each of the buses can alternatively be a single signal line, and each of the single signal lines can alternatively be buses. Signals and signaling links, however shown or described, can be single-ended or differential. Signals shown as having active-high assertion or "true" states, may have opposite assertion states in alternative implementations. A signal driving circuit is said to "output" a signal to a signal receiving circuit when the signal driving circuit asserts (or de-asserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" can include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A method of operation within an integrated-circuit component, the method comprising:

loading a first-in-first-out (FIFO) storage structure with qualification values corresponding to respective pairs of edges expected within a timing strobe signal;

sequentially outputting the qualification values from the FIFO storage structure during respective cycles of the timing strobe signal; and either asserting or deasserting a gate signal during the respective cycles of the timing strobe signal according to the qualification values output from the FIFO storage structure.

2. The method of claim 1 wherein either asserting or deasserting the gate signal during the respective cycles of the timing strobe signal according to the qualification values output from the FIFO comprises, during each of the respective cycles of the timing strobe signal, either asserting or deasserting the gate signal according to a qualification value output from the FIFO storage structure during a preceding cycle of the timing strobe signal, the qualification value output from the FIFO storage structure during the preceding cycle of the timing strobe signal being one of the qualification values sequentially output from the FIFO storage structure.

3. The method of claim 1 wherein loading the FIFO storage structure with qualification values corresponding to respective pairs of edges expected within the timing strobe signal comprises sequentially loading the qualification values into the FIFO storage structure in response to transitions of a reference clock signal having a mesochronous timing relationship with the timing strobe signal.

4. The method of claim 1 wherein loading the FIFO storage structure with qualification values corresponding to respective pairs of edges expected within the timing strobe signal comprises loading, as each of the qualification values, a single-bit data value having either a first logic state or a second logic state according to whether the corresponding pair of edges within the timing strobe signal is to be applied to sample a data signal transmitted to the integrated-circuit component.

5. The method of claim 1 further comprising logically combining the gate signal and the timing strobe signal to produce a gated strobe signal having fewer pairs of edges than expected within the timing strobe signal.

6. The method of claim 1 wherein the timing strobe signal is characterized by a preamble waveform that precedes active pairs of edges and a postamble waveform that succeeds the active pairs of edges, the active pairs of edges indicating presence of valid data symbols in a data waveform received within the integrated-circuit component, the method further comprising asserting the gate signal in response to detecting a characteristic feature of the preamble waveform.

7. The method of claim 6 wherein characteristic feature of the preamble waveform comprises at least one of a transition of the timing strobe signal from a first logic level to a second logic level or a predetermined logic level of the timing strobe signal.

8. The method of claim 6 wherein asserting the gate signal in response to detection of the characteristic feature of the preamble waveform comprises (i) asserting an enable signal at a time indicated by a reference clock signal having a mesochronous timing relationship with the timing strobe signal, and (ii) asserting the gate signal in response to appearance of the characteristic feature within the preamble waveform while the first enable signal is asserted.

9. The method of claim 8 wherein asserting the gate signal in response to appearance of the characteristic feature within the preamble waveform comprises asserting the gate signal during an interval that spans an initial one of the active pairs of edges.

10. The method of claim 9 wherein either asserting or deasserting the gate signal during the respective cycles of the timing strobe signal according to the qualification values output from the FIFO comprises asserting the gate signal, during respective intervals that span each of the active pairs of edges that follow the initial one of the active pairs of edges, in response to respective ones of the qualification values sequentially output from the FIFO.

11. An integrated-circuit component comprising:
a first-in-first-out (FIFO) storage structure to store qualification values corresponding to respective pairs of edges expected within a timing strobe signal and to sequentially output the qualification values during respective cycles of the timing strobe signal; and
first logic circuitry to either assert or deassert a gate signal during the respective cycles of the timing strobe signal according to the qualification values output from the FIFO storage structure.

12. The integrated-circuit component of claim 11 wherein the first logic circuitry to either assert or deassert the gate signal during the respective cycles of the timing strobe signal according to the qualification values output from the FIFO comprises circuitry to either assert or deassert the gate signal during each of the respective cycles of the timing strobe signal according to a qualification value output from the FIFO storage structure during a preceding cycle of the timing strobe signal, the qualification value output from the FIFO storage structure during the preceding cycle of the timing strobe signal being one of the qualification values sequentially output from the FIFO storage structure.

13. The integrated-circuit component of claim 11 wherein the first-in-first-out (FIFO) storage structure to store qualification values corresponding to respective pairs of edges expected within the timing strobe signal comprises write circuitry to sequentially store the qualification values within the FIFO storage structure in response to transitions of a reference clock signal having a mesochronous timing relationship with the timing strobe signal.

14. The integrated-circuit component of claim 11 wherein the first-in-first-out (FIFO) storage structure to store qualification values corresponding to respective pairs of edges expected within the timing strobe signal comprises write circuitry to store within the FIFO storage structure, as each of the qualification values, a single-bit data value having either a first logic state or a second logic state according to whether the corresponding pair of edges within the timing strobe signal is to be applied to sample a data signal transmitted to the integrated-circuit component.

15. The integrated-circuit component of claim 11 further comprising second logic circuitry to generate, based on the gate signal and the timing strobe signal, a gated strobe signal having fewer pairs of edges than expected within the timing strobe signal.

16. The integrated-circuit component of claim 11 wherein the timing strobe signal is characterized by a preamble waveform that precedes active pairs of edges and a postamble waveform that succeeds the active pairs of edges, the active pairs of edges indicating presence of valid data symbols in a data waveform received within the integrated-circuit component, the integrated-circuit component further comprising second logic circuitry to detect a characteristic feature of the preamble waveform and to assert the gate signal in response to detecting the characteristic feature of the preamble waveform.

17. The integrated-circuit component of claim 16 wherein characteristic feature of the preamble waveform comprises at least one of a transition of the timing strobe signal from a first logic level to a second logic level or a predetermined logic level of the timing strobe signal.

18. The integrated-circuit component of claim 16 wherein second logic circuitry to detect a characteristic feature of the preamble waveform and to assert the gate signal in response to detecting the characteristic feature of the preamble waveform comprises circuitry to (i) assert an enable signal at a time indicated by a reference clock signal having a mesochronous timing relationship with the timing strobe signal, and (ii) assert the gate signal in response to appearance of the characteristic feature within the preamble waveform while the first enable signal is asserted.

19. The integrated-circuit component of claim 18 wherein the circuitry to assert the gate signal in response to appearance of the characteristic feature within the preamble waveform comprises circuitry to assert the gate signal during an interval that spans an initial one of the active pairs of edges.

20. The integrated-circuit component of claim 19 wherein the first logic circuitry to either assert or deassert the gate signal during the respective cycles of the timing strobe signal according to the qualification values output from the FIFO comprises circuitry to assert the gate signal, during respective intervals that span each of the active pairs of edges that follow the initial one of the active pairs of edges, in response to respective ones of the qualification values sequentially output from the FIFO.

21. An integrated circuit component comprising:
a first-in-first-out (FIFO) storage structure;
means for loading the FIFO storage structure with qualification values corresponding to respective pairs of edges expected within a timing strobe signal;
means for sequentially outputting the qualification values from the FIFO storage structure during respective cycles of the timing strobe signal; and
means for either asserting or deasserting a gate signal during the respective cycles of the timing strobe signal according to the qualification values output from the FIFO storage structure.

* * * * *